(12) United States Patent
Chen

(10) Patent No.: US 7,218,528 B2
(45) Date of Patent: May 15, 2007

(54) DUAL CONNECTING INTERFACE MEMORY CARD

(75) Inventor: Chien-Yuan Chen, 5F-1, No. 8, Sec. 3, Shuangsh Rd., Banchiau City, Taipei (TW) 220

(73) Assignees: Power Digital Card Co., Ltd., Taipei (TW); Chien-Yuan Chen, Taipei (TW)

( * ) Notice: Subject to any disclaimer, the term of this patent is extended or adjusted under 35 U.S.C. 154(b) by 139 days.

(21) Appl. No.: 11/156,726

(22) Filed: Jun. 21, 2005

(65) Prior Publication Data

US 2006/0288145 A1    Dec. 21, 2006

(51) Int. Cl.
*H05K 1/14* (2006.01)
*G06K 19/06* (2006.01)
*H01R 25/00* (2006.01)

(52) U.S. Cl. ............... 361/737; 235/487; 439/638; 710/301

(58) Field of Classification Search ............ 710/301, 710/72, 62–64; 439/147, 153–155, 638, 439/945, 946; 235/487, 492, 493, 441; 361/737, 361/752
See application file for complete search history.

(56) References Cited

U.S. PATENT DOCUMENTS

| | | | |
|---|---|---|---|
| 6,567,273 B1 * | 5/2003 | Liu et al. | 361/737 |
| 6,676,420 B1 * | 1/2004 | Liu et al. | 439/131 |
| 6,744,634 B2 * | 6/2004 | Yen | 361/752 |
| 6,776,348 B2 * | 8/2004 | Liu et al. | 235/492 |
| 6,813,164 B2 * | 11/2004 | Yen | 361/785 |
| 6,908,038 B1 * | 6/2005 | Le | 235/492 |
| 7,152,801 B2 * | 12/2006 | Cuellar et al. | 235/492 |
| 2004/0087213 A1 * | 5/2004 | Kao | 439/638 |
| 2005/0182858 A1 * | 8/2005 | Lo et al. | 710/1 |
| 2005/0230483 A1 * | 10/2005 | Miller et al. | 235/492 |
| 2006/0112197 A1 * | 5/2006 | Yao | 710/15 |

* cited by examiner

*Primary Examiner*—Christopher Lee
*Assistant Examiner*—Trisha Vu
(74) *Attorney, Agent, or Firm*—Troxell Law Office PLLC

(57) ABSTRACT

A dual connecting interface memory card directed to a flash memory card, one edge of which is configured with MMC standard connecting terminals, and another edge is configured with a 4-pin USB standard connecting terminal. A detachable cutaway piece is disposed at a side of the edge having the USB standard connecting terminals. After detaching the cutaway piece, it is embedded onto a bottom portion of the edge having the USB standard connecting terminals, thereby forming an end compliant with USB connector port specifications for plugging therein. Hence, the dual connecting interface memory card achieves integrating MMC and USB standards into one memory card.

8 Claims, 5 Drawing Sheets

DUAL CONNECTING INTERFACE MEMORY CARD

BACKGROUND OF THE INVENTION (a) Field of the Invention

The present invention relates to a dual connecting interface memory card, and more particularly to a flash memory card that integrates a 4-pin USB (Universal Serial Bus) connecting terminal structure into an existing MMC (Multi Media Card) standard flash memory card, thereby providing two standard connecting interfaces to access data stored in the memory card.

(b) Description of the Prior Art

The characteristics of flash memory include being able to retain the data stored therein when the power supply to the flash memory is disconnected, and the non-requirement for a motor to actuate it. Such characteristics have made flash memory find favor with related electrical appliance industries. However, in order to accommodate the demand for portability of stored data, many operators have developed information and electrical appliances with a flash memory card embedded inside, including such products as: mobile phones, PDAs (personal digital assistant), digital cameras, MP3 music players, and so on. Thus, the extensive and rapid rise in use of flash memory embedded in information products can be seen in order to meet the growing demand for data access.

However, competition and division of interests in related industries have resulted in manufacturers one after another developing their own flash memory card each conforming to different standards, including a Compact-Flash Card, abbreviated to CF card, a Secure-Digital Card, abbreviated to SD card, a Memory-Stick Card abbreviated to MS card, a Smart-Media Card, abbreviated to SM card, a XD Picture Card abbreviated to XD card, a Multi Media Card abbreviated to MMC card, and a Smart Media Card, abbreviated to SM card. The aforementioned memory card standards are those currently found on the market.

External form, thickness, width, length and the connecting terminals are used to distinguish the different memory card standards. However, it can also be said that the number of connecting terminal pins of the aforementioned existing memory cards is somewhat convoluted. Moreover, the different memory cards are not mutually compatible, for instance, the CF card has 50 pins, the SD card has 9 pins, the MS card has 10 pins, the MMC card has 7 pins, the SM card has 22 pins, and so on. Furthermore, each memory card standard requires a specific card reader device to read the data stored therein. Although currently there are multi-card readers able to read memory cards conforming to different standards, however, the multi-card reader device must accurately calculate the position of the connecting terminal pins of various different memory card standards in order to differentiate the different memory cards. Hence, the more connecting terminal pins there are, the greater the impact on manufacturing costs and restraint on research and development.

Accordingly, the inventor of the present invention has integrated the common and widespread USB standard connecting interface into an existing MMC standard memory card with the objective to provide a flash memory card having two connecting interfaces.

SUMMARY OF THE INVENTION

A primary object of a dual connecting interface memory card of the present invention is to provide a memory card with a 4-pin USB (Universal Serial Bus) standard connecting terminal integrated into an existing MMC standard flash memory card, thereby providing a memory card having dual connecting interfaces.

Another objective of the dual connecting interface memory card of the present invention is to embed universal serial bus architecture into an existing MMC standard flash memory card, thereby eliminating the need to further develop a new architecture.

The USB architecture has the following characteristics:

1. Possesses superior expansion capability, and is able to serially connect tens of peripheral equipment at one time.

2. Serial connected USB devices occupy the same set of system resources (IRQ (Interrupt Request), DMA (Direct memory Access) and I/O (Input/Output) positions).

3. USB 2.0 is capable of 480 Mb/s high-speed data transmission.

4. A host computer can supply electric power required by peripheral equipment through the USB interface.

5. Hot swapping and plug and play functionality.

Hence, the present invention not only utilizes existing technological resources as a base to realize improvement of prior art, but also integrates two standard connecting interfaces into a memory card to provide access to data stored therein. Accordingly, the present invention assuredly conforms to essential items of a new patent application.

To enable a further understanding of said objectives and the technological methods of the invention herein, brief description of the drawings is provided below followed by detailed description of the preferred embodiments.

DETAILED DESCRIPTION OF THE PREFERRED EMBODIMENTS

Figure 1:
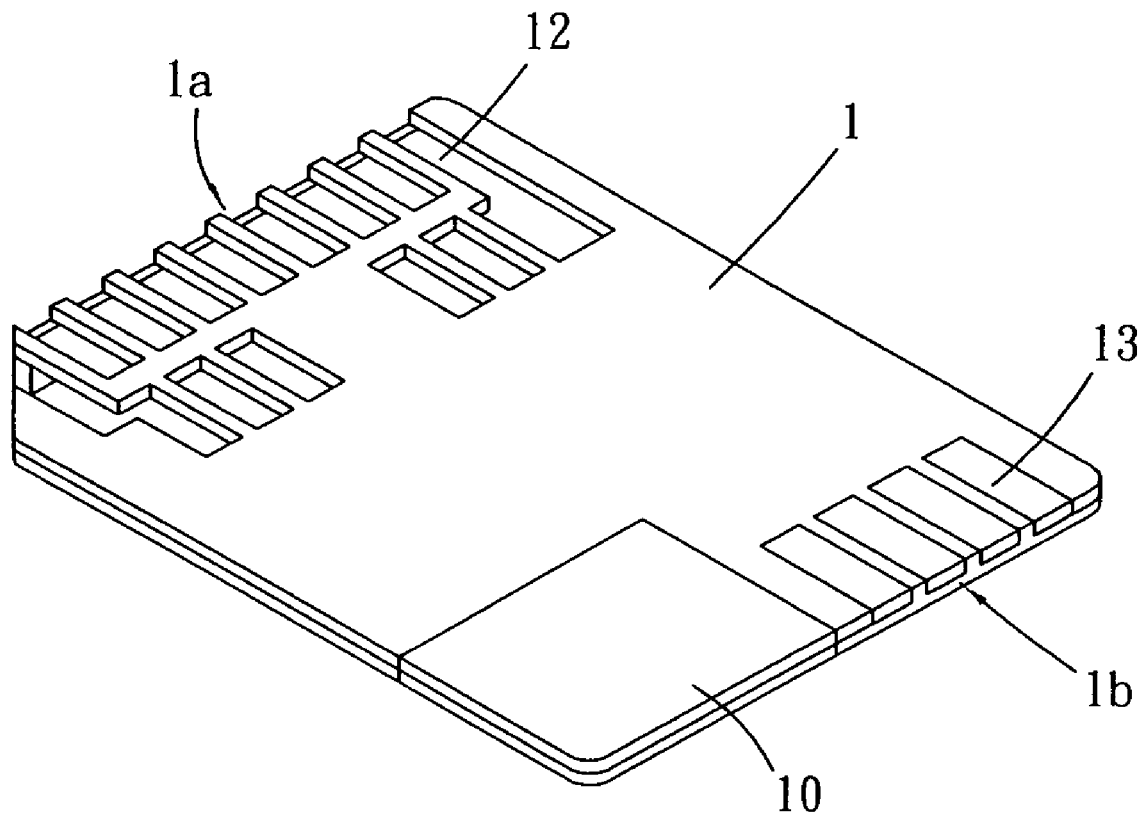
FIG. 1 shows an assembled elevational view according to the present invention.
Figure 2:
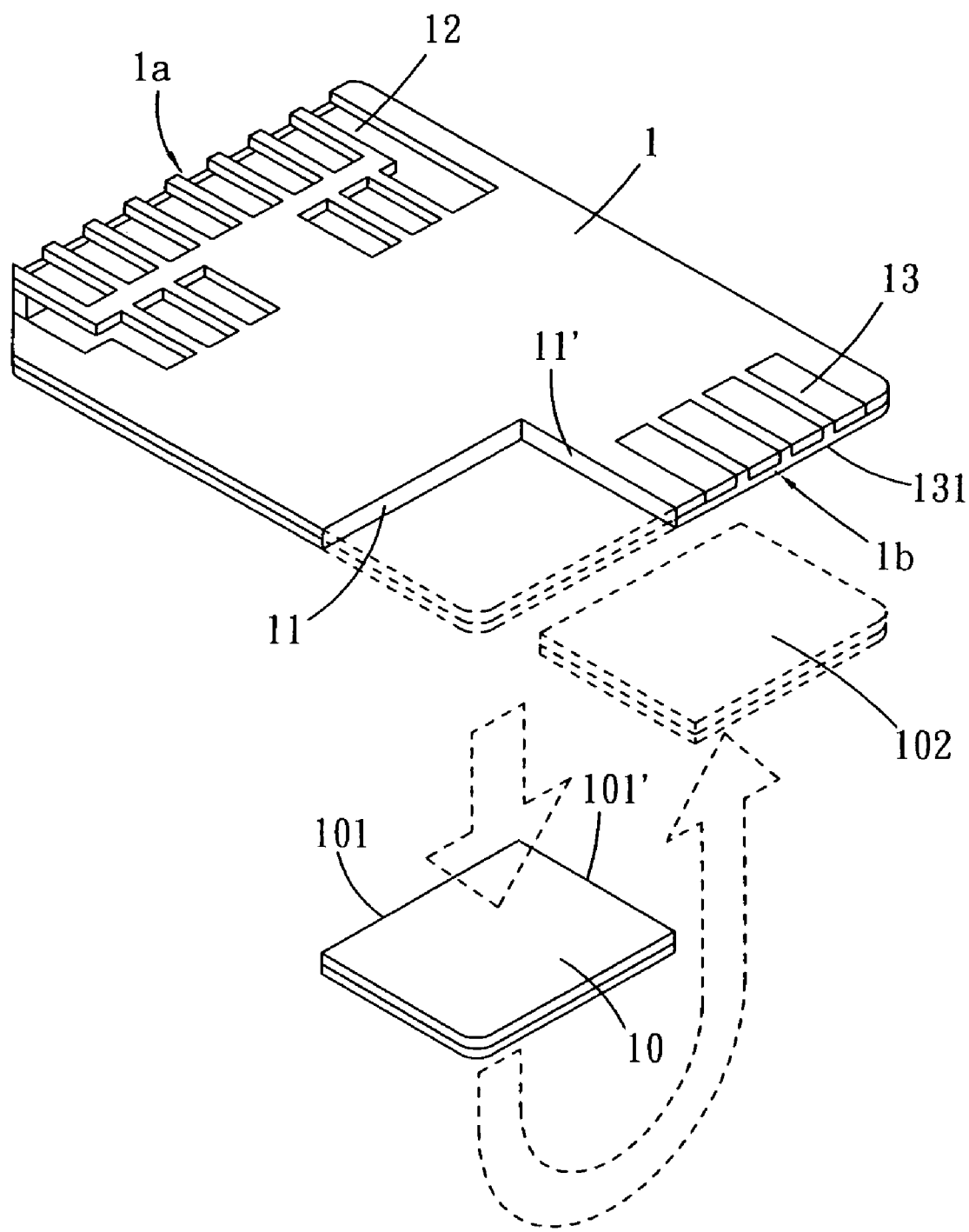
FIG. 2 shows an exploded elevational view according to the present invention.
Figure 3:
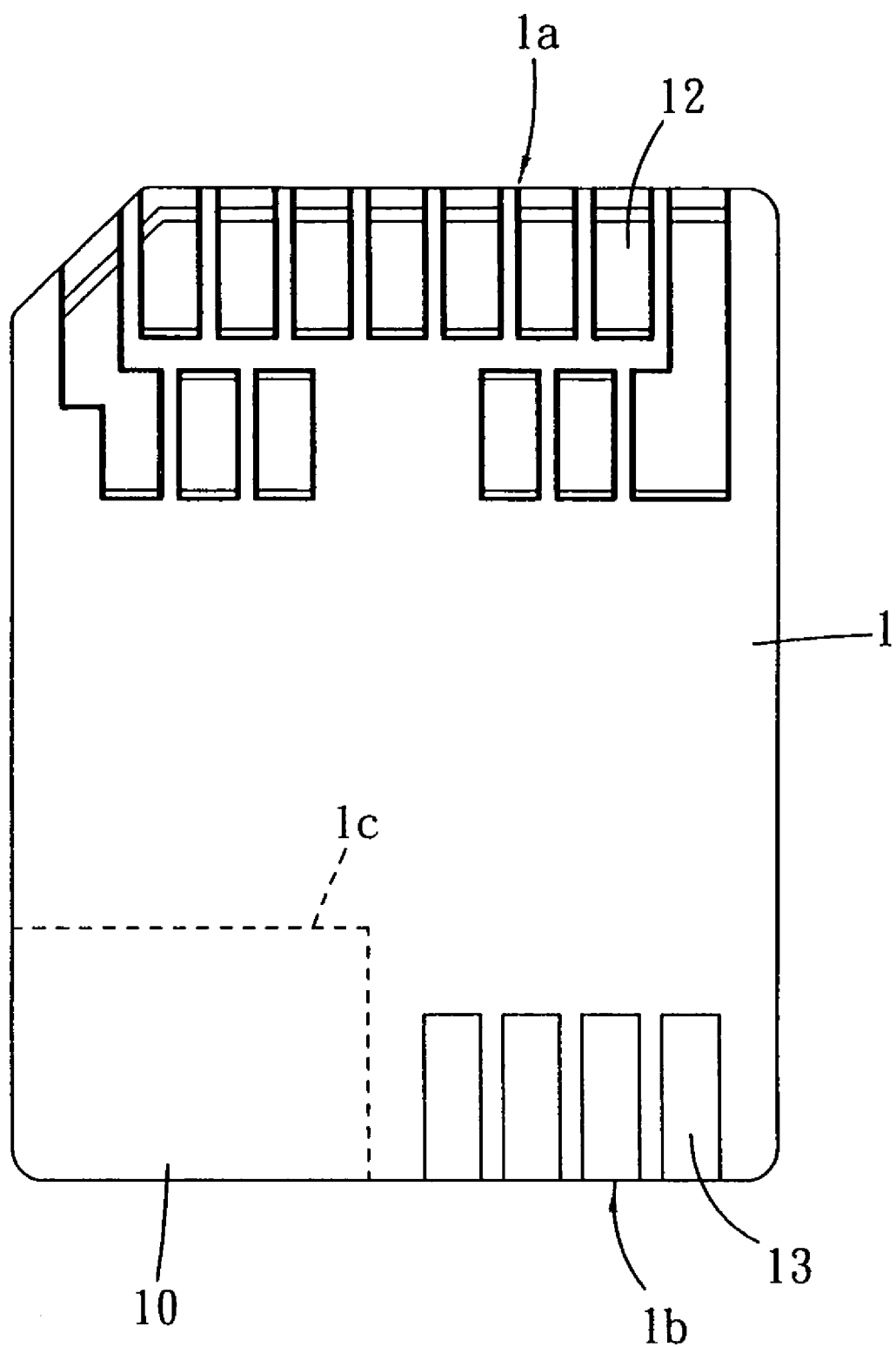
FIG. 3 shows an assembled top view according to the present invention.

Referring to FIGS. 1, 2 and 3, which show a memory card 1 of the present invention, wherein MMC standard connecting terminals 12 are configured at one edge 1a of the memory card 1, and USB standard connecting terminals 13 are configured on another edge 1b of the memory card 1. A freely detachable cutaway piece 10 is disposed at a side of the USB standard connecting terminals 13 of the edge 1b. The cutaway piece 10 can be left in place when using the MMC standard connecting terminals 12 or is detached from the memory card 1 when using the USB standard connecting terminals 13, whereafter a top portion 102 of the detached cutaway piece 10 is embedded onto a bottom portion 131 of the USB standard connecting terminals 13, thereby adding to the thickness of the edge 1b configured with the USB standard connecting terminals 13 in order to conform to the thickness specification of a USB standard connector port.

The cutaway piece 10 is attached to and detached from the memory card 1 by using corresponding embedding fasteners configured on a L-shaped wall surface 11, 11' of a notch 1c of the memory card 1 and side walls 101, 101' of the cutaway piece 10, which provide for an embedding assembly of the cutaway piece 10 and the notch 1c of the memory card 1. Furthermore, the top portion 102 of the cutaway piece 10 and the bottom portion 131 of the edge 1b configured with the USB standard connecting terminals 13 are also configured with corresponding embedding fasteners, which provide for the top portion 102 of the cutaway piece 10 to mutually embed onto the bottom portion 131 of the USB standard connecting terminals 13 in order to conform to the thickness required by a USB standard connector port when using the USB standard connecting terminals 13 to connect therein. Wherein the embedding fasteners are respectively of sunken form and raised form or vice versa, or the embedding fasteners on the L-shaped wall surface 11, 11' and the side walls 101, 101' can be apertures and catch pieces respectively or vice versa, thereby enabling mutual embedding, or a wedge-shaped groove and corresponding protruding piece can be used in an interlocking arrangement to secure the cutaway piece 10 to the memory card 1. In practice, any structure that can provide an embedding assembly of the cutaway piece 10 and the memory card 1 can be utilized in the present invention.

Figure 4:
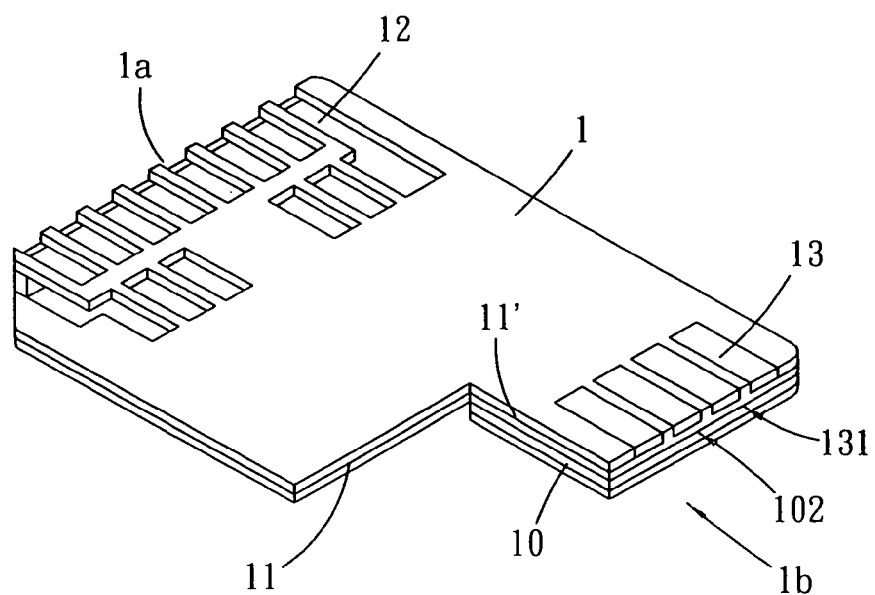
FIG. 4 shows an elevational view of a cutaway piece embedded onto a bottom portion of USB standard connecting terminals according to the present invention.
Figure 5:
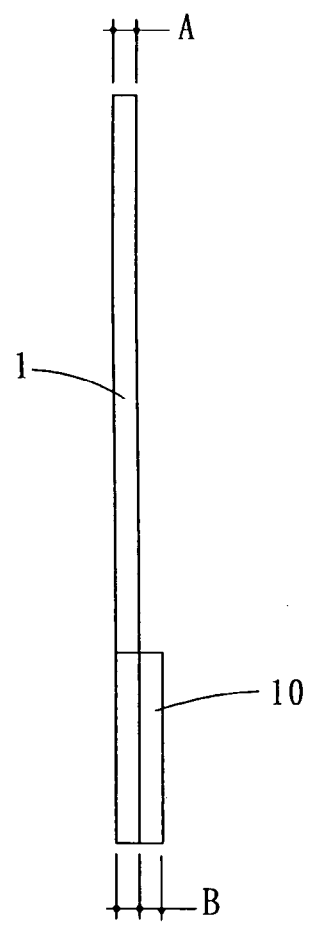
FIG. 5 shows a side view of the cutaway piece embedded onto the bottom portion of the USB standard connecting terminals according to the present invention.

Referring also to FIGS. 4 and 5, which respectively show an elevational view and a side view of the cutaway piece 10 embedded onto the MMC standard memory card 1 of the present invention. To accommodate requirements of a MMC standard memory card device, thickness A of the MMC standard memory card 1 is 1.4 mm. However, because the thickness A is insufficient to comply with the 2.2 mm thickness required of a USB connector port, thus, the cutaway piece 10 is designed to be 0.8 mm thick. Hence, when the memory card 1 is to be connected to a USB standard connector port, the cutaway piece 10 is first detached from the notch 1c of the memory card 1, and then the top portion 102 of the cutaway piece 10 is embedded onto the bottom portion 131 of the USB standard connecting terminals 13. Thus, the 0.8 mm thickness of the cutaway piece 10 added to the 1.4 mm thickness of the MMC standard memory card 1 provides a thickness B of the edge 1b configured with the USB standard connecting terminals 13 equal to 2.2 mm, which conforms to the thickness required of a USB standard connector port.

Figure 6:
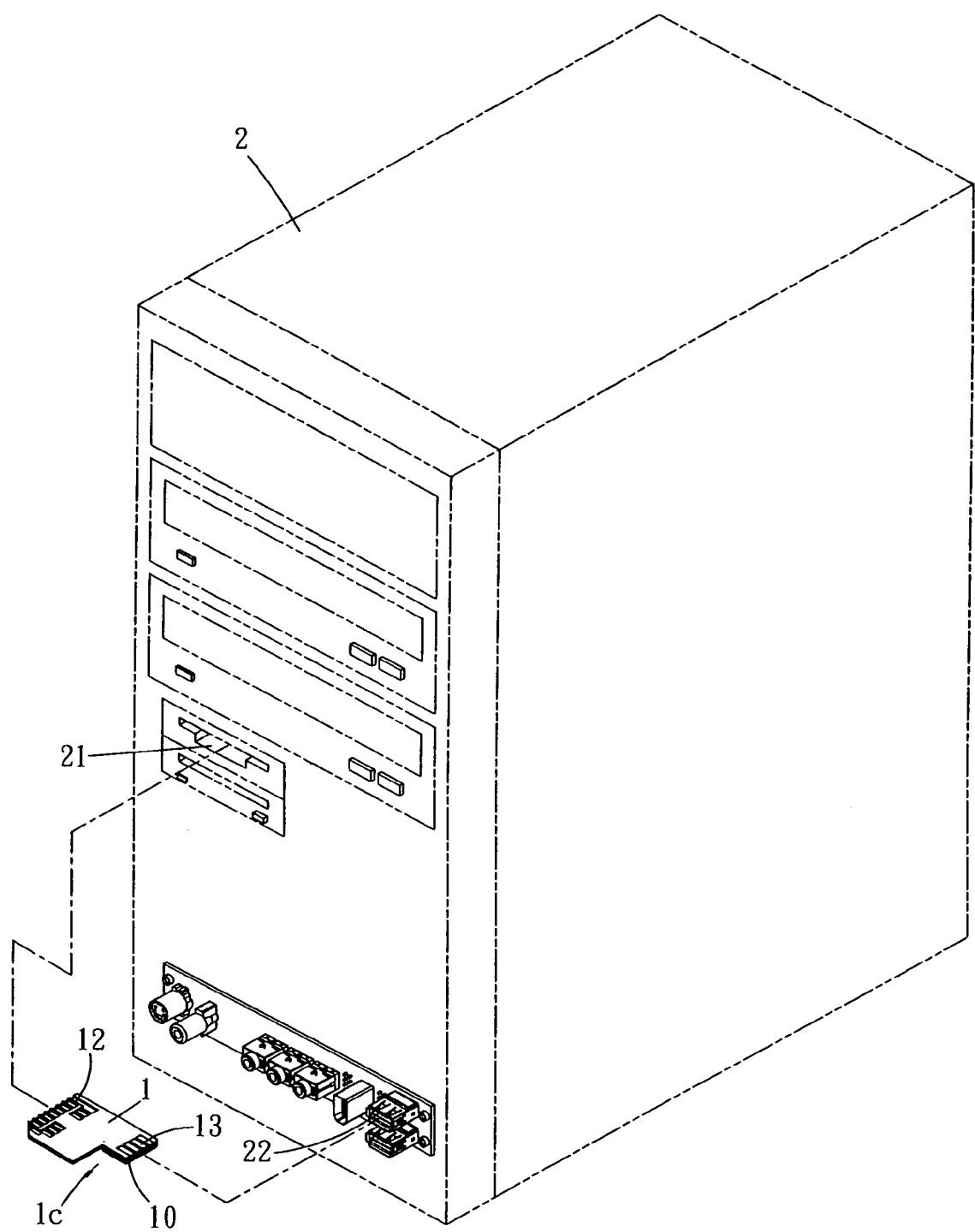
FIG. 6 shows a schematic view depicting use of the present invention.

Finally, referring to FIG. 6, which depicts the MMC standard memory card 1 of the present invention in use, wherein the edge 1a of one end is configured with the MMC standard connecting terminals 12, which can be plugged into a MMC standard card reader device 21 of a host computer 2, thereby enabling access to data stored in the memory card 1. In addition, when the memory card 1 of the present invention needs to be connected to a USB standard connector port 22, then the cutaway piece 10 of the edge 1b at the other end of the memory card 1 is detached from the memory card 1 (see FIG. 2), and then the edge 1b having USB standard connecting terminals 13 is plugged into the corresponding USB standard connector port 22 of the host computer 2. Because the USB standard is provided with support for hot swapping and plug and play functionality, and because of the commonality and extensive use of the USB standard connecting interface in current information products, thus, a current MMC standard memory card and the USB standard connecting terminals 13 have been integrated into one package, thereby achieving the objective of providing a flash memory card having dual MMC and USB standard connecting interfaces, which facilitates the user in plugging in the memory card 1 and accessing data therein, and eliminates the restriction of having to use a memory card of specific standard or the need to use a specific card reader device. Hence, the present invention has resolved the problem of limitations imposed by standards when accessing data stored in a memory card.

It is of course to be understood that the embodiments described herein are merely illustrative of the principles of the invention and that a wide variety of modifications thereto may be effected by persons skilled in the art without departing from the spirit and scope of the invention as set forth in the following claims.

What is claimed is:

1. A dual connecting interface memory card comprising a 4-pin USB standard connecting terminal configured on an edge of a MMC flash memory card, and characterized in that a freely detachable cutaway piece is disposed at a side of the USB standard connecting terminals; embedding fasteners are configured on side walls of the cutaway piece corresponding to embedding fasteners on a L-shaped wall surface of a notch of the memory card, thereby enabling mutual embedding of the cutaway piece and the memory card; furthermore, embedding fasteners are configured on a top portion of the cutaway piece to correspond to embedding fasteners of a bottom portion of the edge having the USB standard connecting terminals;

whereby, after detaching the cutaway piece, it is then embedded onto the bottom portion of the edge having the USB standard connecting terminals in order to satisfy thickness of a USB connector port, thus making the thickness of the edge configured with the USB standard connecting terminals sufficient to comply with that required for plugging into a USB connector port, and enabling access to data stored therein; the dual connecting interface memory card thus achieves providing a memory card having the USB standard connecting terminal integrated into a MMC standard memory card.

2. The dual connecting interface memory card according to claim 1, wherein the embedding fasteners on the L-shaped wall surface of the notch of the memory card and the side walls of the cutaway piece are male fasteners and female fasteners respectively or vice versa.

3. The dual connecting interface memory card according to claim 1, wherein the embedding fasteners on the L-shaped wall surface of the notch of the memory card and the side walls of the cutaway piece are apertures and catch pieces respectively or vice versa.

4. The dual connecting interface memory card according to claim 1, wherein the embedding fasteners on the L-shaped wall surface of the notch of the memory card and the side walls of the cutaway piece are configured as wedge-shaped grooves and corresponding protruding pieces, and disposed in a mutual interlocking arrangement.

5. The dual connecting interface memory card according to claim 1, wherein the embedding fasteners of the top portion of the cutaway piece and the bottom portion of the edge having the USB standard connecting terminals are male fasteners and female fasteners respectively or vice versa.

6. The dual connecting interface memory card according to claim 1, wherein the embedding fasteners of the top portion of the cutaway piece and the bottom portion of the edge having the USB standard connecting terminals are apertures and catch pieces respectively or vice versa.

7. The dual connecting interface memory card according to claim 1, wherein the embedding fasteners of the top portion of the cutaway piece and the bottom portion of the edge having the USB standard connecting terminals are configured as wedge-shaped grooves and corresponding protruding pieces, and disposed in a mutual interlocking arrangement.

8. The dual connecting interface memory card according to claim 1, wherein thickness of the edge configured with the USB standard connecting terminals of the memory card complies with size specifications of a USB connector port.

* * * * *